United States Patent
Hakotani et al.

(10) Patent No.: US 6,592,986 B1
(45) Date of Patent: Jul. 15, 2003

(54) MATERIAL FOR MOLDING THERMOSETTING RESIN SHEET, PRODUCTION PROCESS, AND MOLDED PRODUCT

(75) Inventors: Masahiro Hakotani, Kamakura (JP); Koichi Akiyama, Kamakura (JP); Hiromu Miyashita, Hamamatsu (JP); Takashi Shibata, Kawanishi (JP)

(73) Assignee: Mitsui Takeda Chemicals Inc., Tokyo (JP)

(*) Notice: Subject to any disclaimer, the term of this patent is extended or adjusted under 35 U.S.C. 154(b) by 0 days.

(21) Appl. No.: 09/701,135

(22) PCT Filed: May 25, 1999

(86) PCT No.: PCT/JP99/02719
§ 371 (c)(1),
(2), (4) Date: Nov. 24, 2000

(87) PCT Pub. No.: WO99/61239
PCT Pub. Date: Dec. 2, 1999

(30) Foreign Application Priority Data

May 26, 1998 (JP) .......................................... 10-144381

(51) Int. Cl.⁷ .............................................. B32B 27/38
(52) U.S. Cl. .................... 428/332; 428/413; 428/295.1; 428/297.4; 428/301.4
(58) Field of Search .............................. 428/413, 295.1; 524/492, 297.4, 493, 301.4, 332, 859; 523/209, 216, 149

(56) References Cited

U.S. PATENT DOCUMENTS

| | | | |
|---|---|---|---|
| 4,227,037 A | * 10/1980 | Layton | 174/35 |
| 4,434,023 A | 2/1984 | Kanamori et al. | 156/307.3 |
| 4,534,886 A | 8/1985 | Kraus et al. | 252/502 |
| 4,689,098 A | 8/1987 | Gaughan | 156/62.2 |
| 4,882,089 A | 11/1989 | Iwaskow et al. | 428/242 |
| 5,366,664 A | * 11/1994 | Varadan et al. | 252/512 |

FOREIGN PATENT DOCUMENTS

| | | |
|---|---|---|
| JP | 50-112466 | 9/1975 |
| JP | 51-131574 | 11/1976 |
| JP | 59-75927 | 4/1984 |
| JP | 59-138439 | 8/1984 |
| JP | 60-179243 | 9/1985 |
| JP | 63-145340 | 6/1988 |
| JP | 3-70628 | 11/1991 |

* cited by examiner

Primary Examiner—Robert Dawson
Assistant Examiner—Christopher M Keehan
(74) Attorney, Agent, or Firm—Wenderoth, Lind & Ponack, L.L.P.

(57) ABSTRACT

The present invention presents an SMC with which the electrically conductive layer does not break down or become non-uniform during molding and with which molded articles with excellent electromagnetic wave shielding capability and electric conductivity can be produced. This SMC is a thermosetting resin sheet molding compound having at least one continuous layer of electrically conductive fibers with a fiber length of 50 μ to 5 mm, and it is further preferred that electrically conductive powder is uniformly dispersed throughout the entire molding compound. These SMCs can be produced by impregnating a reinforcing material with a thermosetting resin composition which is combined with the above-mentioned electrically conductive fibers, or the electrically conductive fibers and electrically conductive powder, and forming at least one continuous layer of these electrically conductive fibers adjacent to this reinforcement layer.

7 Claims, 1 Drawing Sheet

CONDUCTIVE FIBER LAYER

LAYER OF REINFORCING FIBERS + RESIN COMPOUND

SCHEMATIC CROSS SECTION OF SMC IN WHICH ELECTRICALLY CONDUCTIVE FIBER-CONTAINING RESIN COMPOUND IS APPLIED TO UNDER AND UPPER CARRIER FILMS AND IMPREGNATED WITH THE RESIN.

SCHEMATIC VIEW OF SMC IMPREGNATION DEVICE

SCHEMATIC CROSS SECTION OF SMC IN WHICH ELECTRICALLY
CONDUCTIVE FIBER-CONTAINING RESIN COMPOUND IS APPLIED
TO UNDER AND UPPER CARRIER FILMS AND IMPREGNATED
WITH THE RESIN.

SCHEMATIC CROSS SECTION OF A MOLDED ARTICLE IN WHICH
3 LAYERS OF THE SMC IN FIGURE 2 HAVE BEEN LAMINATED
AND MOLDED.

MATERIAL FOR MOLDING THERMOSETTING RESIN SHEET, PRODUCTION PROCESS, AND MOLDED PRODUCT

This application is a 371 of PCT/JP99/02719 filed May 25, 1999.

1. Technical Field

The present invention relates to a thermosetting resin sheet molding compound having at least one continuous layer consisting of electrically conductive fibers with a short fiber length and being particularly excellent in terms of electromagnetic wave shielding capability and electric conductivity and a method of producing the same.

2. Background Art

Fiber-reinforced plastics (FRPs) that use unsaturated polyester resins have high productivity, in addition to having excellent mechanical strength, heat resistance, water resistance, and chemical resistance, and therefore, they are used as materials for outside panels and outside accessories, beginning with home fixtures, such as bath tubs, wash basins, etc., and also in the field of automobiles. Electromagnetic wave shielding capability has recently come into demand, even in FRP molded articles, because of problems with electromagnetic interference (EMI) and several electromagnetic wave shielding FRPs have already been developed. An example is applying paint with shielding performance to the surface of molded articles. Moreover, there is another example produced by forming an electrically conductive sheet by impregnating a nonwoven cloth with a thermosetting resin comprising metal powder and molding the sheet into one unit with an SMC (Japanese Laid Open-Patent Application No. 59-138439) and glass cloths or mats that have been given electric conductivity by coating with aluminum and molded as one unit with a thermosetting resin (Japanese Laid-Open Patent Application No. 60-179243). However, there are problems with such methods in that breaking and elongation of the electrically conductive fiber layer occur during molding, thereby resulting in shorting of the electrically conductive layer, a reduction in density and non-uniformity. Proposals have been made to solve this disadvantage. In Japanese Patent Publication No. 3-70628, there is proposed molded articles produced by overlapping a glass fiber layer of short fibers impregnated with unsaturated polyester resin, a mat layer (middle layer) of electrically conductive fibers impregnated with unsaturated polyester resin, and a glass fiber layer (glass cloth) of long fibers and molding them under heat and compression.

However, by means of this method as well, the electrically conductive layer is formed from an electrically conductive mat and therefore, for instance, when a molded article of a complex shape is molded, stress is applied as a result of deformation of the electrically conductive mat during molding and the electrically conductive layer eventually breaks down and becomes non-uniform. Therefore, this method is not satisfactory.

DISCLOSURE OF THE INVENTION

Under these circumstances, the purpose of the present invention is to present a thermosetting resin sheet molding compound with which molded articles with excellent electromagnetic wave shielding capability and electric conductivity can be obtained without causing breakage or non-uniformity, since the electrically conductive layer of the compound follows perfectly the shape even when the compound is formed into a molded article with a complex shape.

As a result of intense studies, the inventor completed the present invention upon discovering that forming a continuous layer of electrically conductive fibers consisting of short fibers of a specific length is effective.

That is, the present invention relates to (1) a thermosetting resin sheet molding compound, comprising at least one continuous layer of electrically conductive fibers with a fiber length of $50\mu$~5 mm;

(2) a thermosetting resin sheet molding compound according to the above-mentioned item(1) wherein the continuous layer of electrically conductive fibers is bonded as one unit with a reinforcement layer impregnated with a thermosetting resin composition;

(3) a thermosetting resin sheet molding compound according to the above-mentioned item (1) or (2), wherein an electrically conductive powder is uniformly dispersed throughout the entire molding compound;

(4) a thermosetting resin sheet molding compound according to any one of the above-mentioned items (1) through (3), wherein the continuous layer of electrically conductive fibers is formed by causing a thermosetting resin composition which comprises electrically conductive fibers, or electrically conductive fibers and electrically conductive powder mixed therein to penetrate into a reinforcement layer with;

(5) a method of producing the thermosetting resin sheet molding compound according to the above-mentioned item (1), comprising the step of forming at least one continuous layer of electrically conductive fibers with a fiber length of $50\mu$ to 5 mm adjacent to a reinforcement layer impregnated with a thermosetting resin composition;

(6) a method of producing a thermosetting resin sheet molding compound according to any one of the above-mentioned items (1) through (3), comprising the step of causing a thermosetting resin composition which comprises electrically conductive fibers having a fiber length of $50\mu$~5 mm, or electrically conductive fibers and electrically conductive powder mixed therein, to penetrate into a reinforcement layer with; and (7) a molded article, wherein the molding compound according to any one of the above-mentioned items (1) through (4) is cured in a mold.

BEST MODE FOR CARRYING OUT THE INVENTION

The thermosetting resin sheet molding compound of the present invention must have a continuous layer of electrically conductive fibers of a specific fiber length. This fiber length is $50\mu$~5 mm, preferably 0.2 mm~1 mm. If fiber length is shorter than $50\mu$, the electrically conductive fibers mixed with the resin compound will pass through the reinforcement layer when they are impregnated with the thermosetting resin and therefore, it will not be possible to form the continuous layer of electrically conductive fibers. Moreover, if the fibers have a length exceeding 5 mm, they will make it difficult to apply the resin compound to the carrier film when being impregnated with a conventional thermosetting resin impregnating device. In particular, when the fiber length of the electrically conductive fibers is 0.2 mm or longer, it will be possible to improve even further electromagnetic wave shielding capability because there will be less of the above-mentioned penetration of the reinforcement layer and when it is no longer than 1 mm, viscosity of the resin mixture will be lower and therefore, an SMC can be easily produced.

The above-mentioned continuous layer of electrically conductive fibers is preferably bonded as one unit with a reinforcement layer impregnated with the thermosetting resin. Moreover, this continuous layer of electrically conductive fibers is preferably formed by penetration via application or impregnation, etc., of the reinforcement layer with the thermosetting resin composition in which electrically conductive fibers have been mixed. In this case, the resin component penetrates the reinforcement layer and the continuous layer of electrically conductive fibers is formed remaining on the surface of the reinforcement layer. However, some of the electrically conductive fibers will penetrate the reinforcement layer with the resin component. Nevertheless, it is essential to the present invention that a continuous layer of electrically conductive fibers of a specific length be formed and there will be no particular problems, even if some of the electrically conductive fibers penetrate the reinforcement layer, as long as this continuous layer can be formed. The continuous layer of electrically conductive fibers should be formed such that it can provide the molded article with sufficient electromagnetic wave shielding capability and electric conductivity. Three to 50 parts, preferably 5 to 30 parts, of electrically conductive fibers per 100 parts of thermosetting resin should be used. The thickness of the electrically conductive fiber layer is approximately 0.01 to 5.0 mm, preferably 0.1 to 1.0 mm.

Figure 2:
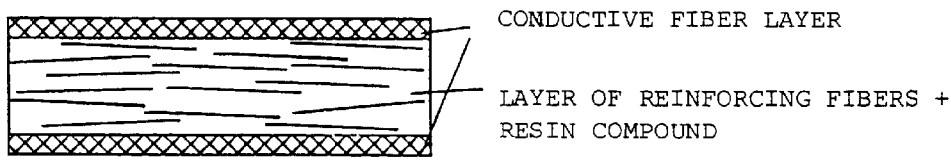
FIG. 2 is a schematic representation of an example of the thermosetting resin sheet molding compound of the present invention.
Figure 3:
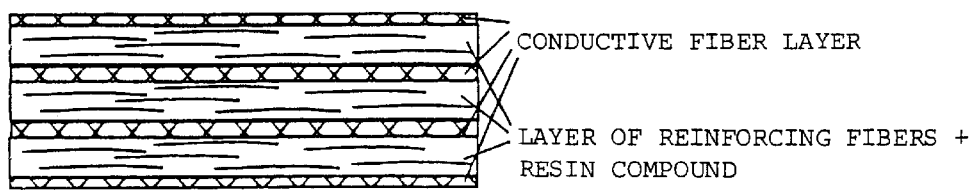
FIG. 3 is a schematic representation of another example.

In the present invention, as long as the above-mentioned continuous layer of electrically conductive fibers is present as at least one layer of the thermosetting resin sheet molding compound, it can be on both surfaces or on one surface and further, on the inside of the thermosetting resin molding compound. Thus, the thermosetting resin sheet molding compound of the present invention can use a variety of layered structures as needed for the purpose of the same. Layered structures of the thermosetting resin sheet molding compound of the present invention is shown in FIG. 2 and FIG. 3.

In contrast to the case where a conventional nonwoven cloth containing metal powder or flakes, or a glass cloth or mat coated with aluminum, is used, a continuous layer of electrically conductive fibers having a specific fiber length is selected for the thermosetting resin sheet molding compound of the present invention and the fibers comprising the electrically conductive layer are very short. As a result, when molded into a complex shape, the conductive layer of the present invention can retain continuity and freely follow the same shape closely so that there is no breakdown or non-uniformity of the electrically conductive layer. Thus, the thermosetting resin sheet molding compound of the present invention can be used for molded articles of any shape and is very useful for a variety of purposes requiring electric conductivity and electromagnetic wave shielding capability. This point is epoch-making when compared to conventional sheet molding compounds with electrically conductive layers.

Thermosetting resins that are used as thermosetting resin molding compounds can be given as the thermosetting resins used in the thermosetting resin sheet molding compound of the present invention. Examples are unsaturated polyester resin, vinyl ester resin, epoxy resin, phenol resin, etc. However, unsaturated polyester resin is most preferred. Unsaturated polyester resin generally consists of unsaturated polyester and vinyl monomer and, depending on the case, thermoplastic resin and additive (agent).

Unsaturated polyester (a) used in the present invention is synthesized by condensation of $\alpha,\beta$-olefin unsaturated dicarboxylic acid and dihydric glycol. A saturated dicarboxylic acid or aromatic dicarboxylic acid or dicyclopentadiene that will react with dicarboxylic acids, etc., can be concomitantly used in addition to the above two components in the synthesis of this polyester. Maleic acid, fumaric acid, itaconic acid, citraconic acid and anhydrides of these dicarboxylic acids are examples of the $\alpha,\beta$-olefin unsaturated carboxylic acids. Adipic acid, sebacic acid, succinic acid, gluconic acid, phthalic anhydride, o-phthalic acid, isophthalic acid, terephthalic acid, tetrahydrophthalic acid, tetrachlorophthalic acid, etc., are examples of dicarboxylic acids that are used concomitantly with these $\alpha,\beta$-olefin dicarboxylic acids. Alkane diol, oxaalkane diol, diols of alkylene oxide obtained by addition of ethylene oxide or propylene oxide, etc., to bisphenol A, etc., for instance, are used as the dihydric glycolic acid. In addition to these, monools and trihydric triols can also be used. Examples of alkanediols are ethylene glycol, 1,2-propylene glycol, 1,3-propylene glycol, 1,3-butanediol, 1,4-butanediol, neopentyl glycol, 1,5-pentane diol, 1,6-hexanediol, cyclohexanediol, etc. Examples of oxaalkane diols are dioxyethylene glycol, triethylene glycol, etc. Examples of monooles or trihydric alcohols to be used together with these glycols are octyl alcohol, oleyl alcohol, trimethylol propane, etc. synthesis of the unsaturated polyester is generally conducted while heating and the reaction proceeds as the water by-product is eliminated. By means of the present invention, an unsaturated polyester with an average molecular weight of 800 to 4,000 and an acid number of 20 to 60 is used.

Monovinyl (b) that is a conventional diluent or crosslinking agent of unsaturated polyesters, such as the aromatic monovinyl monomers of styrene, p-chlorostyrene, vinyl toluene, etc., and acrylic monovinyl monomer, such as acrylic acid, acrylic acid methyl ester, methacrylic acid, methacrylic acid methyl ester, acrylonitrile, etc., can be given as examples of the above-mentioned vinyl monomer used in the present invention, but styrene is particularly preferred. This vinyl monomer is usually mixed with the unsaturated polyester and thermoplastic resin as a diluent of unsaturated polyester (a) and thermoplastic resin (c).

Thermoplastic resin that is widely used as a conventional shrinkage-reducing agent for unsaturated polyester can be given as the above-mentioned thermoplastic resin (c) used in the present invention. Examples of such a resin are polybutadiene or its hydrogenation product, polyisoprene or its hydrogenation product, aromatic vinyl/conjugate diene block copolymer or its hydrogenation product, polystyrene, styrene/vinyl acetate block copolymer, polyvinyl acetate, polymethyl methacrylate, etc. Saturated polyester (molecular weight of 3,000 to 100,000), polyether, etc., can also be mentioned.

A variety of short fibers that have been surface treated to provide or enhance electric conductivity, beginning with carbon fibers and metal fibers, can be used as electrically conductive fibers (d) of the present invention. However, as previously mentioned, these short fibers must have a specific fiber length.

Moreover, electrically conductive carbon black, metal powder, powder that has been treated to provide a variety of powders with electric conductivity, etc., are given as examples of the electrically conductive powder used in the present invention, but electrically conductive carbon black is particularly preferred.

Dispersion of the electrically conductive fibers is localized in the thermosetting resin sheet molding compound in order to form a continuous layer, whereas it is important for the electrically conductive powder to be uniformly dispersed throughout the entire thermosetting resin molding compound. The particle size of the powder is within a range of 0.5 μm to 50 μm, particularly 10 μm to 40 μm. When the particle size is less than 0.5 μm, the surface area of the powder increases and the amount of oil absorbed increases and therefore, the viscosity of the resin compound increases and application to the carrier film is difficult when impregnating with a thermosetting resin impregnating device. Moreover, when particle size exceeds 50 μm, it becomes difficult for the powder to pass through the reinforcement layer and uniform dispersion is not possible during impregnation. In particular, when particle diameter of the electrically conductive powder is within a range of 10 μm to 40 μm, the electrically conductive powder is uniformly dispersed and therefore, excellent electromagnetic wave shielding capability can be obtained, and viscosity of the resin compound becomes low and therefore, production is simple. There are 0.5 to 300 parts, preferably 1 to 10 parts, more preferably 1 to 5 parts, of the electrically conductive powder per 100 parts of the thermosetting resin.

The above-mentioned electrically conductive powder is uniformly dispersed throughout the entire thermosetting resin sheet molding compound. Consequently, there is better electric contact between the electrically conductive fibers within the electrically conductive fiber layer and the multiple electrically conductive fiber layers present in the direction of thickness are electrically continuous with one another because the layer made from reinforcing fibers and resin compound is also given electric conductivity. It appears that this makes better electromagnetic wave shielding capability possible.

Besides the above-mentioned components, other thermoplastic resins, fillers, curing agents, curing regulators, pigments, and thickeners can be mixed as needed with the resin composition of the present invention. Calcium carbonate, aluminum hydroxide, etc., are examples of fillers. Peroxyesters typified by t-butyl-peroxybenzoate and t-butyl peroctoate; peroxyketals typified by 1,1-bis(t-butylperoxy) 3,3,5-trimethylcyclohexane; peroxycarbonates typified by t-butylperoxyisopropyl carbonate, etc., are given as the curing agent, and it is preferred that 1 to 3 parts by weight of at least one thereof per 100 parts by weight of the mixture of (a)~(d) be used. Parabenzoquinone, t-butylcatechol, etc., are given as curing regulators. Carbon black, titanium oxide, iron oxide red, phthalocyanine blue, etc., are given as pigments. Oxides and hydroxides of magnesium, calcium, etc., are given as thickeners.

In addition, fiber-reinforcement is preferred for the reinforcement layer used in the present invention. When the continuous layer of electrically conductive fibers is formed in the present invention, the thermosetting resin composition comprising electrically conductive fibers is applied to and impregnates the reinforcement layer and then the resin component penetrates so that a continuous layer of electrically conductive fibers is formed. Accordingly, reinforcements in fiber form with good penetrability is advantageous from this point. Glass fibers, carbon fibers, aramide fibers, etc., are given as this type of reinforcing material in fiber form, but glass fibers are particularly preferred.

Figure 1:
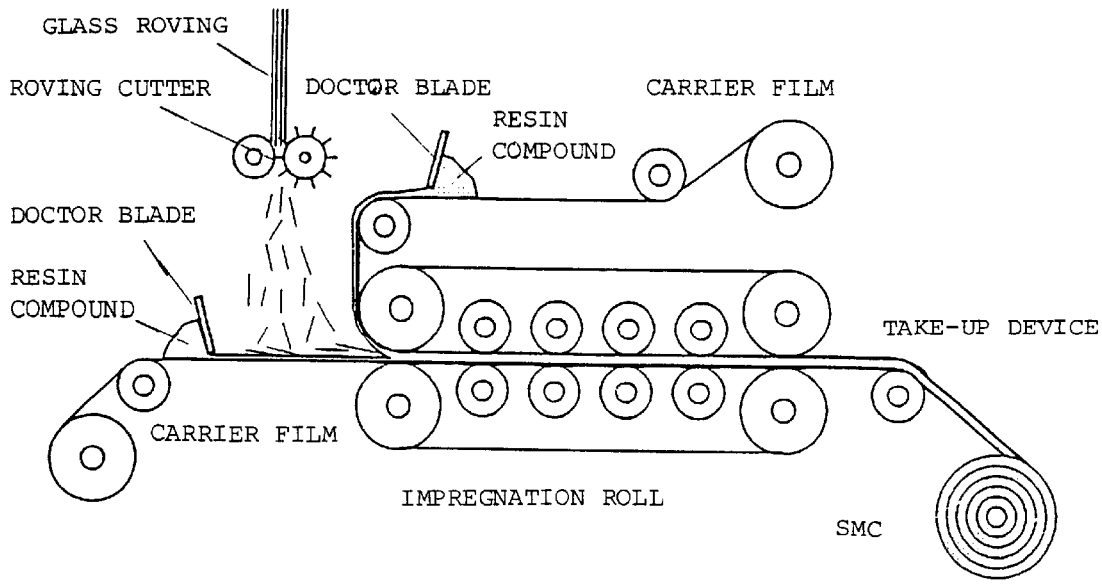
FIG. 1 is a general explanatory drawing of a device for producing the thermosetting resin sheet molding compound of the present invention.

The thermosetting resin sheet molding compound of the present invention is preferably produced, as in the same manner as usually practiced for the production of SMCs, for example by impregnating the reinforcing material such as glass fibers (having, for instance, a diameter of approximately 8 to 20 μm and a length of ½ to 4 inches) with a resin composition in which the above-mentioned various compounding agents have been mixed, using conventional means and equipment. A diagram of the SMC impregnating device used as the equipment for producing the thermosetting resin sheet molding compound of the present invention is shown in FIG. 1. Reinforcing material, such as glass fibers, etc., is usually mixed at approximately 5 to 60 wt % per total amount of molding compound. The SMC of the present invention can be cured by heating and compression (pressure of 5 to 12 MPa and temperature of 70 to 180° C.) in a mold to make a molded article.

Examples are given below to more specifically explain the present invention.

EXAMPLES

The shielding effect is represented by the following 2 types of evaluation methods in the examples and comparative examples given below:

(1) Shielding effect (dB)=20 log (Eo/Es)

Eo here is electromagnetic waves that were determined when there was no test sample and Es is electromagnetic waves that were determined when the electromagnetic waves were blocked by each shielding material (electromagnetic waves that passed through the shielding material).

(2) In addition to the shielding effect found by the above-mentioned formula, the electromagnetic wave transmittances in the examples and comparative examples were determined by the following formula for better understanding and are shown in Table 1.

Electromagnetic wave transmittance (%)=Es/Eo×100% (Es and Eo are the same as in the above-mentioned description.)

Example 1

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S231 (milled product with an average fiber length of 0.13 mm) (manufactured by Osaka Gas Chemicals Co., Ltd.)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. The thus obtained compound was uniformly applied to an under polyethylene carrier film using a conventional SMC impregnating device after adjusting the space between the doctor blade and the carrier film so that the amount applied would be 105 g per 300 mm×300 mm. Next, E glass roving SM 22 (manufactured by Japan Glass Fiber Co., Ltd.) cut to a length of 1 inch with a roving cutter, which had been adjusted at such a revolution speed as to disperse the glass roving in an amount of 90 g per 300 mm×300 mm was dispersed over the compound. An upper polyethylene carrier film to which the same resin compound was applied as on the under carrier film was further superposed on the glass roving layer so that the glass roving was impregnated with the resin composition using an impregnating roller. After making a roll, the rolled compound was cured for 24 hours at 40° C. to obtain a molding compound of the present invention. The thus obtained molding compound was black on both faces and by and large white on the inside. The resin compound components other than the carbon fibers are by and large colorless or by and large white and therefore, it appears that the carbon fibers in the resin compound were localized at the surface of the molding compound to form a carbon fiber layer without penetrating into the glass roving layer.

This molding compound was cut to 190 mm×190 mm and 4 sheets were stacked up. The resultant compound stack was placed in the center of a mold designed for provide a molded sheet of 300 mm×300 mm and heated and pressed for 3 minutes under conditions of 140° C. and 10 MPa to obtain a 300 mm×300 mm molded sheet with a thickness of 3 mm. As a result of measuring the surface resistance by JIS K 6911 and the electromagnetic wave shielding effects by the Advantest method for the molded sheet that was obtained, the respective properties were good, as shown in Table 1.

Example 2

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S242, milled product with an average fiber length of 0.37 mm) (manufactured by Osaka Gas Chemicals Co., Ltd.)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound of the present invention was obtained by the same method as in Example 1. The molding compound thus obtained was black on both faces and by and large white on the inside. The resin compound components other than the carbon fibers are by and large colorless or by and large white and therefore, it appears that the carbon fibers in the resin compound were localized at the surface of the molding compound to form a carbon fiber layer without penetrating into the glass roving layer.

A molded sheet was obtained from this molding compound by the same method as in Example 1. As a result of measuring the surface resistance by JIS K 6911 and the electromagnetic wave shielding effects by the Advantest method for the molded sheet that was obtained, the respective properties were good, as shown in Table 1.

Example 3

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S244, milled product with an average fiber length of 0.70 mm) (manufactured by Osaka Gas Chemicals Co., Ltd.)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound of the present invention was obtained by the same method as in Example 1. The molding compound that was obtained was black on both faces and by and large white on the inside. The resin compound components other than the carbon fibers are by and large colorless or by and large white and therefore, it appears that the carbon fibers in the resin compound were localized at the surface of the molding compound to form a carbon fiber layer without penetrating the glass roving layer.

A molded sheet was obtained from this molding compound by the same method as in Example 1. As a result of measuring the surface resistance by JIS K 6911 and the electromagnetic wave shielding effects by the Advantest method for the molded sheet that was obtained, the respective properties were good, as shown in Table 1.

Example 4

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S231 milled product with an average fiber length of 3.0 mm) (manufactured by Osaka Gas Chemicals Co., Ltd.)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound of the present invention was obtained by the same method as in Example 1. The molding compound that was obtained was black on both faces and by and large white on the inside. The resin compound components other than the carbon fibers are by and large colorless or by and large white and therefore, it appears that the carbon fibers in the resin compound were localized at the surface of the molding compound to form a carbon fiber layer without penetrating into the glass roving layer.

A molded sheet was obtained from this molding compound by the same method as in Example 1. As a result of measuring the surface resistance by JIS K 6911 and the electromagnetic wave shielding effects by the Advantest method for the molded sheet that was obtained, the respective properties were good, as shown in Table 1.

Example 5

As shown in Table 1, 1 part of t-butyl peroxybenzoate, 0.01 part of parabenzoquinone, 4 parts of zinc stearate, 100 parts of calcium carbonate, and 5 parts of pitch carbon short fibers [Donacarbo S244, milled product with an average fiber length of 0.70 mm) (manufactured by Osaka Gas Chemicals Co., Ltd.)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound of the present invention was obtained by the same method as in Example 1. The molding compound that was obtained was black on both faces and by and large white on the inside. The resin compound components other than the carbon fibers are by and large colorless or by and large white and therefore, it appears that the carbon fibers in the resin compound were localized at the surface of the molding compound to form a carbon fiber layer without penetrating into the glass roving layer.

A molded sheet was obtained from this molding compound by the same method as in Example 1. As a result of measuring the surface resistance by JIS K 6911 and the electromagnetic wave shielding effects by the Advantest method for the molded sheet that was obtained, the respective properties were good, as shown in Table 1.

Example 6

As shown in Table 1, 1 part of t-butyl peroxybenzoate, 0.01 part of parabenzoquinone, 4 parts of zinc stearate, 100 parts of calcium carbonate, 8 parts of pitch carbon short fibers [Donacarbo S244, milled product with an average fiber length of 0.70 mm) (manufactured by Osaka Gas Chemicals Co., Ltd.)], and 2 parts of by weight conductive carbon black [Ketjen Black EC (manufactured by Ketjen Black International Company)] were added to 100 parts by weight unsaturated of polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound of the present invention was obtained by the same method as in Example 1. The molding compound thus obtained was wholly black. Since it is considered from the results in Examples 3 and 5 that the carbon fibers in the resin compound are localized at the surface of the molding compound without penetrating into the glass roving layer, it seems that the electrically conductive carbon black makes the entire molding compound black and the electrically conductive carbon black is uniformly dispersed throughout the entire molding compound.

A molded sheet was obtained from this molding compound by the same method as in Example 1. As a result of measuring the surface resistance by JIS K 6911 and the electromagnetic wave shielding effects by the Advantest method for the molded sheet that was obtained, the respective properties were good, as shown in Table 1.

Comparative Example 1

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S232 (milled product with an average fiber of 6.0 mm) were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Attempts were made to uniformly apply this compound to an under polyethylene carrier film using a conventional SMC impregnating device after adjusting the space between the doctor blade and carrier film so that the amount applied would be 105 g per 300 mm×300 mm, but almost none of the carbon fibers could pass through the doctor blade and uniform application was not possible. Therefore, production with a conventional SMC impregnating device was not possible.

Comparative Example 2

As shown in Table 1, 1 part of t-butyl peroxybenzoate, 0.01 part of parabenzoquinone, 4 parts of zinc stearate, 100 parts of calcium carbonate, and 10 parts of carbon black powder [manufactured by Ketjen Black EC (Ketjen Black International Company)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. The compound was uniformly applied to an under polyethylene carrier film using a conventional SMC impregnating device after adjusting the space between the doctor blade and the carrier film so that the amount applied would be 105 g per 300 mm×300 mm. Next, E glass roving SM 22 (manufactured by Japan Glass Fiber Co., Ltd.) cut to a length of 1 inch with a roving cutter, which had been adjusted at such a revolution speed as to disperse the glass roving in an amount of 90 g per 300 mm×300 mm, was dispersed over the compound. An upper polyethylene carrier film to which the same resin compound was applied as on the under carrier film was further laid on the glass roving layer so that the glass roving was impregnated with the resin composition using an impregnating roller. After making a roll, the rolled material was cured for 24 hours at 40° C. to obtain a molding compound. The molding compound thus obtained was wholly black and it appears that the resin compound had uniformly penetrated into the glass roving layer.

A molded sheet was obtained from this molding compound by the same method as in Example 1. As a result of measuring the surface resistance by JIS K 6911 and the electromagnetic wave shielding effects by the Advantest method for the molded sheet that was obtained, the electrical conductivity was as good as conventional electrically conductive molding compounds, but there was no electromagnetic wave shielding effect, as shown in Table 1.

Comparative Example 3

As shown in Table 1, 1 part of t-butyl peroxybenzoate, 0.01 part of parabenzoquinone, 4 parts of zinc stearate, and 100 parts of calcium carbonate were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Using the thus obtained resin compound, a molding compound was obtained by the same method as in Example 1.

This molding compound was cut to 190 mm×190 mm and 4 sheets of the molding compound were layered over one another. One sheet of carbon paper [Donacarbo S-252 (manufactured by Osaka Gas Chemicals Co., Ltd.)] was placed on top of the laminated compound and the resultant compound was placed in the center of a mold designed to provide a molded sheet of 300 m². The compound was heated and pressed under conditions of 140° C. and 10 MPa and a 300 mm×300 mm molded sheet was obtained with a thickness of 3 mm. The carbon paper that had been layered over the molding compound tore with the pulling of the molding compound that accompanied molding and in the surface of the molded article there were areas where carbon fibers were present and areas where they were not present. Moreover, as a result of measuring the surface resistance by JIS K 6911 and the electromagnetic wave shielding effects by the Advantest method, there were parts that had the same electric conductivity as in the inventive examples and parts that merely had the same electric conductivity as a conventional SMC molded sheet, depending on where surface resistance was measured, making the compound inappropriate as the intended electrically conductive compound. Moreover, as shown in Table 1, there were no electromagnetic wave shielding effects.

Comparative Example 4

As shown in Table 1, the same molding compound as in Comparative Example 3 was cut to 190 mm×190 mm and 4 sheets were stacked up. One sheet of carbon cloth [Pyrofil TR3110M (manufactured by Mitsubishi Rayon Co., Ltd.)] that had been cut to the same size as the sheet molding compound was placed on the stacked compound and the stacked compound was placed in the center of a mold designed to provide a molded sheet of 300 mm×300 mm. Then, the compound was heated and pressed for 3 minutes under conditions of 140° C. and 10 MPa to obtain a 300 mm×300 mm molded sheet with a thickness of 3 mm. The carbon cloth did not follow the pulling of the molding compound that accompanied molding and stayed at its position before molding so that there were no carbon fibers whatsoever around the outside of the molded sheet that was obtained. Thus, because the carbon cloth is not pulled when the carbon cloth and molding compound are simultaneously molded, the degree of freedom in terms of shape is low, making the compound inappropriate for molding.

Comparative Example 5

As shown in Table 1, 1 part of t-butyl peroxybenzoate, 0.01 part of parabenzoquinone, 4 parts of zinc stearate, 100 parts of calcium carbonate, and 10 parts of pitch carbon short fibers [Donacarbo S244 (milled product with an average fiber length of 0.70 mm) (manufactured by Osaka Gas Chemicals Co., Ltd.)] were added to 100 parts of by weight unsaturated polyester resin [Polymal 6409 (Manufactured by Takeda Chemical Ind., Ltd.)] and dispersed with stirring. Then, 1 part of magnesium oxide was added and thoroughly stirred to obtain a resin compound. Moreover, E, glass roving SM22 (manufactured by Japan Glass Fiber Co., Ltd.) was cut to ¼ inch to obtain ¼ inch chopped strands. After mixing 700 g of the resin compound and 300 g of the ¼ inch chopped strands with a conventional BMC kneader, they were cured for 24 hours at 40° C. to obtain a molding compound in a bulk form.

Four-hundred eighty grams of this molding compound were placed in the center of a mold designed to provide a molded sheet of 300 mm×300 mm and heated and pressed for 3 minutes under conditions of 140° C. and 10 MPa to obtain a 300 mm×300 mm molded sheet with a thickness of 3 mm. As a result of measuring the surface resistance by JIS K 6911 and the electromagnetic wave shielding effects by the Advantest method, the electric conductivity was insufficient and there were no electromagnetic wave shielding effects, as shown in Table 1.

Comparative Example 6

As shown in Table 1, 1 part of t-butyl peroxybenzoate, 0.01 part of parabenzoquinone, 4 parts of zinc stearate, 100 parts of calcium carbonate, 8 parts of pitch carbon short fibers [Donacarbo S244 (milled product with an average fiber length of 0.70 mm) (manufactured by Osaka Gas Chemicals Co., Ltd.)], and 2 parts of conductive carbon black [Ketjen Black EC (manufactured by Ketjen Black International Company)] were added to 100 parts by weight of unsaturated polyester resin [Polymal 6409 (manufactured by Takeda Chemical Ind., Ltd.)] and dispersed with stirring. Then, 1 part of magnesium oxide was added and thoroughly stirred to obtain a resin compound. Moreover, E glass roving SM22 (manufactured by Japan Glass Fiber Co., Ltd.) was cut to ¼ inch to obtain ¼ inch chopped strands. After mixing 700 g of the resin compound and 300 g of the ¼ inch chopped strands with a conventional BMC kneader, they were cured for 24 hours at 40° C. to obtain a molding compound in a bulk form.

Four-hundred eighty grams of this molding compound was placed in the center of a mold designed to provide a molded sheet of 300 mm×300 mm and heated and pressed for 3 minutes under conditions of 140° C. and 10 MPa to obtain a 300 mm×300 mm molded sheet with a thickness of 3 mm. As a result of measuring the surface resistance by JIS K 6911, the electric conductivity was close to that of conventional electrically conductive materials, but the electromagnetic wave shielding effects were poor, as shown in Table 1.

TABLE 1

Composition of SMC and Properties

| | | Examples | | | | | | Comparative Examples | | | | | |
|---|---|---|---|---|---|---|---|---|---|---|---|---|---|
| | | 1 | 2 | 3 | 4 | 5 | 6 | 1 | 2 | 3 | 4 | 5 | 6 |
| STARTING MATERIAL | | | | | | | | | | | | | |
| Resin composition | Unsaturated polyester resin | 100 | 100 | 100 | 100 | 100 | 100 | 100 | 100 | 100 | 100 | 100 | 100 |
| | TBPB | 1 | 1 | 1 | 1 | 1 | 1 | 1 | 1 | 1 | 1 | 1 | 1 |
| | PBQ | 0.01 | 0.01 | 0.01 | 0.01 | 0.01 | 0.01 | 0.01 | 0.01 | 0.01 | 0.01 | 0.01 | 0.01 |
| | Calcium carbonate | 100 | 100 | 100 | 100 | 100 | 100 | 100 | 100 | 100 | 100 | 100 | 100 |
| | Zinc stearate | 4 | 4 | 4 | 4 | 4 | 4 | 4 | 4 | 4 | 4 | 4 | 4 |
| | Magnesium oxide | 1 | 1 | 1 | 1 | 1 | 1 | 1 | 1 | 1 | 1 | 1 | 1 |
| | Pitch carbon short fibers (average yarn length) 0.13 mm | 10 | | | | | | | | | | | |
| | 0.37 mm | | 10 | | | | | | | | | | |
| | 0.70 mm | | | 10 | | 5 | 8 | | | | | 10 | 8 |
| | 3.00 mm | | | | 10 | | | | | | | | |
| | 6.00 mm | | | | | | | | | 10 | | | |
| | Conductive carbon black | | | | | | 2 | | 10 | | | | 2 |
| Reinforcing fibers | Amount of glass fibers (wt %) | 30 | 30 | 30 | 30 | 30 | 30 | 30 | 30 | 30 | 30 | 30 | 30 |
| | Length of glass fibers (inch) | 1 | 1 | 1 | 1 | 1 | 1 | 1 | 1 | 1 | 1 | ¼ | ¼ |

TABLE 1-continued

Composition of SMC and Properties

| | Examples | | | | | | Comparative Examples | | | | | |
|---|---|---|---|---|---|---|---|---|---|---|---|---|
| | 1 | 2 | 3 | 4 | 5 | 6 | 1 | 2 | 3 | 4 | 5 | 6 |
| Production device | SMC impregnating device | | | | | | | | | | BMC neader | |
| Unit weight of SMC (g/30cm$^2$) | 300 | 300 | 300 | 300 | 300 | 300 | 300 | 300 | 300 | 300 | — | — |
| Impregnated state | Good | Good | Good | Good | Good | Good | No-good* | Good | Good | Good | Good | Good |
| Molding* | A | A | A | A | A | A | — | A | Carbon paper | Carbon cloth | A | A |
| Surface resistivity (Ω) | 1.2E+06 | 1.3E+06 | 9.4E+05 | 8.8E+05 | 1.2E+06 | 2.3E+05 | — | 3.4E+05 | — | — | 5.1E+11 | 3.2E+07 |
| Shielding effect (dB/30 MHz) | 37 | 38 | 38 | 38 | 34 | 46 | — | 20 or less | — | 20 or less | 20 or less | 28 |
| Electromagnetic wave transmittance (%/30 MHz) | 1.4 | 1.3 | 1.3 | 1.3 | 2.0 | 0.5 | — | 10 or more | — | 10 or more | 10 or more | 4.0 |

*Molding compound only

Among the above examples and comparative examples, when Example 1, Example 2, Example 3, and Example 4, which are different from each other in the shape of the electric-conductivity imparting material contained therein (i.e., average fiber length of 0.13, 0.37, 0.70 and 3.00 mm, respectively) are compared to Comparative Example 1 (average fiber length of 6.00 mm) and Comparative Example 2 (carbon black powder), the following will be noted. In Comparative Example 1, the carbon fibers were caught by the doctor blade of the SMC impregnating device because the fiber length was too long and the resin compound could not be applied to carrier film. Moreover, in Comparative Example 2, a good SMC was obtained and the carbon black powder was uniformly dispersed in the SMC by the glass fibers without separating from the resin components. Therefore, the surface resistivity was the same as in the inventive examples. However, no electromagnetic wave shielding effect was obtained. This makes clear the fact that a resin compound can be formed into an SMC by using an electric-conductivity imparting material having a length within the range specified by the present invention and that because the material that imparts electric conductivity can be localized, electromagnetic wave shielding effects can be obtained with a small amount of the electric-conductivity imparting material.

Furthermore, when Example 6 in which carbon fibers and electrically conductive power were concomitantly used is compared with Example 3 containing only carbon fibers in terms of the effect obtained by the use of electric-conductivity imparting material within the range of length of the present invention in combination with electrically conductive powder uniformly-dispersed throughout the entire molding compound, better results in conductivity and electromagnetic wave shielding effects are shown due to the use of combination thereof.

Attempts were made to mold a conventional SMC in Comparative Example 3 and Comparative Example 4 in which a carbon paper or a carbon cloth was superposed on each SMC at the time of molding. IN the case of Comparative Example 3, the carbon paper tore during molding and there were some areas where there were no carbon fibers whatsoever. On the other hand, in Comparative Example 4, the carbon cloth was still at its original position after molding and there were some places at the ends of the molded article where there were no carbon fibers whatsoever. Electromagnetic wave shielding effects were not obtained in these comparative examples because there were parts of the molded article where there were no carbon fibers whatsoever.

Moreover, when Example 3 and Comparative Example 5 that used the same amount of carbon fibers and Example 6 and Comparative Example 6 that used the same amounts of carbon fibers and electrically conductive carbon black are compared, good electromagnetic wave shielding effects can be obtained in Example 3 and Example 6, but electromagnetic wave shielding effects can not be obtained in Comparative Example 5 and Comparative Example 6. This makes clear the fact that electromagnetic wave shielding capability is low in these comparative examples when compared to Examples 3 and Example 6, because in the comparative examples the carbon fibers were uniformly dispersed in the compound by impregnation using a BMC kneader whereas in the inventive examples the same amount of carbon fibers were localized at the surface of the SMC.

A shielding material must usually have 30 dB or higher and in this sense, none of the comparative examples can be used as a shielding material.

INDUSTRIAL APPLICABILITY

As previously explained, the thermosetting resin sheet molding compound of the present invention has a continuous layer of electrically conductive fibers of a specific fiber length and therefore, it can have sufficient electric conductivity and electromagnetic wave shielding capability, even if the amount of electrically conductive fibers that is used is reduced. Moreover, this continuous layer can closely follow even complex shapes without tearing or becoming non-uniform. Therefore, the molding compound of the present invention can be obtained with high reliability and at low cost. In addition, electromagnetic wave shielding capability can be improved even further by further uniformly dispersing electrically conductive powder throughout the entire molding compound.

What is claimed is:

1. A thermosetting resin impregnated sheet molding compound comprising:

at least one reinforcement layer impregnated with a thermosetting resin and, disposed on at least one side of the reinforcement layer, at least one continuous layer of electrically conductive fibers having a fiber length of 0.2 mm to 1 mm, wherein an electrically conductive powder is uniformly dispersed throughout the reinforcement layer and the continuous layer of electrically conductive fibers.

2. The thermosetting resin impregnated sheet molding compound according to claim 1, wherein the continuous layer of electrically conductive fibers is formed by causing a thermosetting resin composition, which comprises the thermosetting resin, the electrically conductive fibers and the electrically conductive powder, to penetrate into the reinforcement layer.

3. A method for producing a thermosetting resin impregnated sheet molding compound, comprising:

forming at least one continuous layer of electrically conductive fibers having a fiber length of 0.2 mm to 1 mm adjacent to at least one side of a reinforcement layer impregnated with a thermosetting resin, wherein the continuous layer of electrically conductive fibers and the reinforcement layer include an electrically conductive powder.

4. A method for producing a thermosetting resin impregnated sheet molding compound, comprising:

causing a thermosetting resin composition, which comprises a thermosetting resin, electrically conductive fibers having a fiber length of 0.2 mm to 1 mm and an electrically conductive powder, to penetrate into at least one side of a reinforcement layer.

5. A molded article, comprising one or more of the thermosetting resin impregnated sheet molding compounds according to claim 1.

6. A molded article, comprising one or more of the thermosetting resin impregnated sheet molding compounds according to claim 2.

7. A molded article, which is produced by curing one or more of the thermosetting resin impregnated sheet molding compounds according to claim 1 in a mold.

* * * * *